(12) United States Patent
Chueh

(10) Patent No.: US 12,069,799 B2
(45) Date of Patent: Aug. 20, 2024

(54) BRANCH COUPLER HAVING U-SHAPED AND L-SHAPED MICROSTRIP LINES

(71) Applicant: Nanning FuLian FuGui Precision Industrial Co., Ltd., Nanning (CN)

(72) Inventor: Yu-Chih Chueh, New Taipei (TW)

(73) Assignee: Nanning FuLian FuGui Precision Industrial Co., Ltd., Nanning (CN)

( * ) Notice: Subject to any disclaimer, the term of this patent is extended or adjusted under 35 U.S.C. 154(b) by 344 days.

(21) Appl. No.: 17/672,974

(22) Filed: Feb. 16, 2022

(65) Prior Publication Data

US 2023/0262881 A1 Aug. 17, 2023

(51) Int. Cl.
*H05K 1/02* (2006.01)
*H01R 12/70* (2011.01)

(52) U.S. Cl.
CPC ........ *H05K 1/0251* (2013.01); *H01R 12/7082* (2013.01); *H05K 2201/09254* (2013.01)

(58) Field of Classification Search
CPC ... H01R 12/7082; H05K 1/0251–2201/09254; H01P 1/2013–5/227
See application file for complete search history.

(56) References Cited

U.S. PATENT DOCUMENTS

| | | | |
|---|---|---|---|
| 8,013,427 B2 * | 9/2011 | Maetani | H05K 1/0245 257/664 |
| 2017/0222295 A1 | 8/2017 | Uher et al. | |
| 2021/0111590 A1 * | 4/2021 | Kawai | H02J 50/12 |

* cited by examiner

*Primary Examiner* — Vanessa Girardi
(74) *Attorney, Agent, or Firm* — ScienBiziP, P.C.

(57) ABSTRACT

A branch coupler includes a first branch, comprising an input end, an isolation end, a first transmission line, a first branch line and a second branch line, the input end is electrically connected to the isolation end through the first transmission line, the first branch line is electrically connected to input end, and second branch line is electrically connected to the isolation end; a second branch, comprising a first output end, a second output end, a second transmission line, a third branch line and a fourth branch line, the first output end and the second output end are connected through second transmission line, the third branch line is connected to the first output end, and the fourth branch line is connected to the second output end; the first branch line is connected to the third branch line, and the second branch line is connected to the fourth branch line.

7 Claims, 9 Drawing Sheets

US 12,069,799 B2

BRANCH COUPLER HAVING U-SHAPED AND L-SHAPED MICROSTRIP LINES

FIELD

The present disclosure relates to a field of couplers, in particular to a branch coupler.

BACKGROUND

With the development of communication technology, all kinds of communication products are becoming more and more miniaturized. However, the current branch coupler has a large area and occupies a large area of PCB, which is not conducive to the miniaturization of communication products.

BRIEF DESCRIPTION OF THE DRAWINGS

Implementations of the present technology will now be described, by way of example only, with reference to the attached figures.

DETAILED DESCRIPTION

Figure 1:
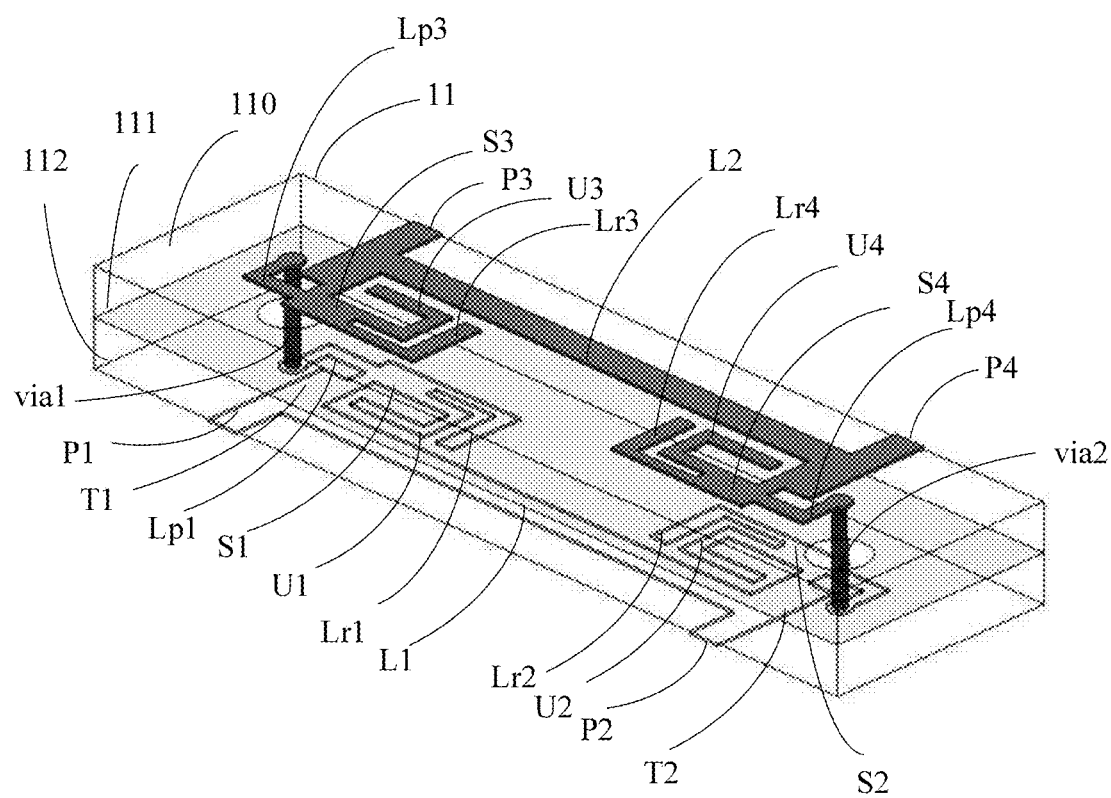
FIG. 1 is a three-dimensional structural diagram of a branch coupler according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean at least one.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

Figure 2:
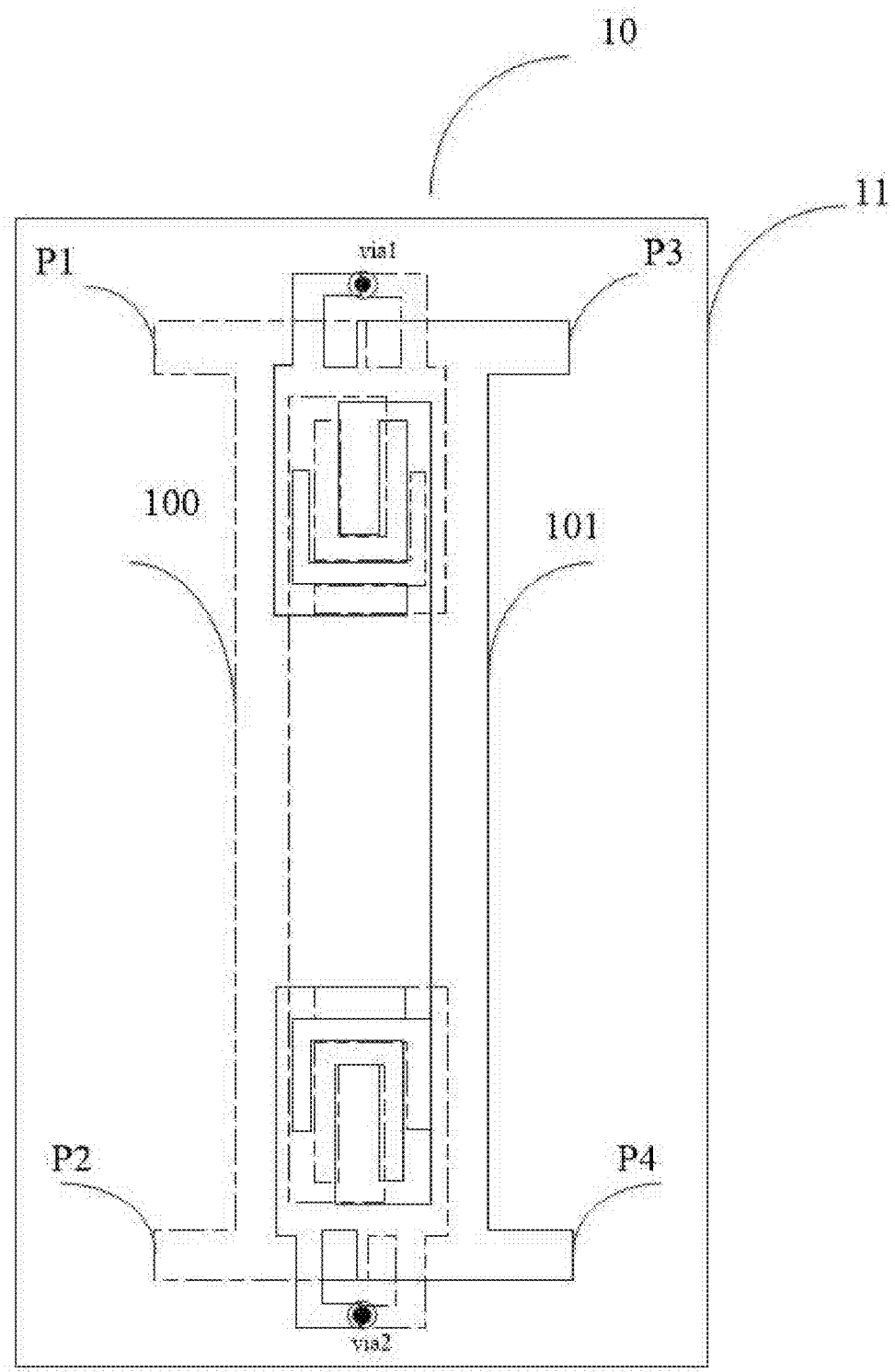
FIG. 2 is a structural diagram of a branch coupler according to the first embodiment of the present disclosure.
Figure 3:
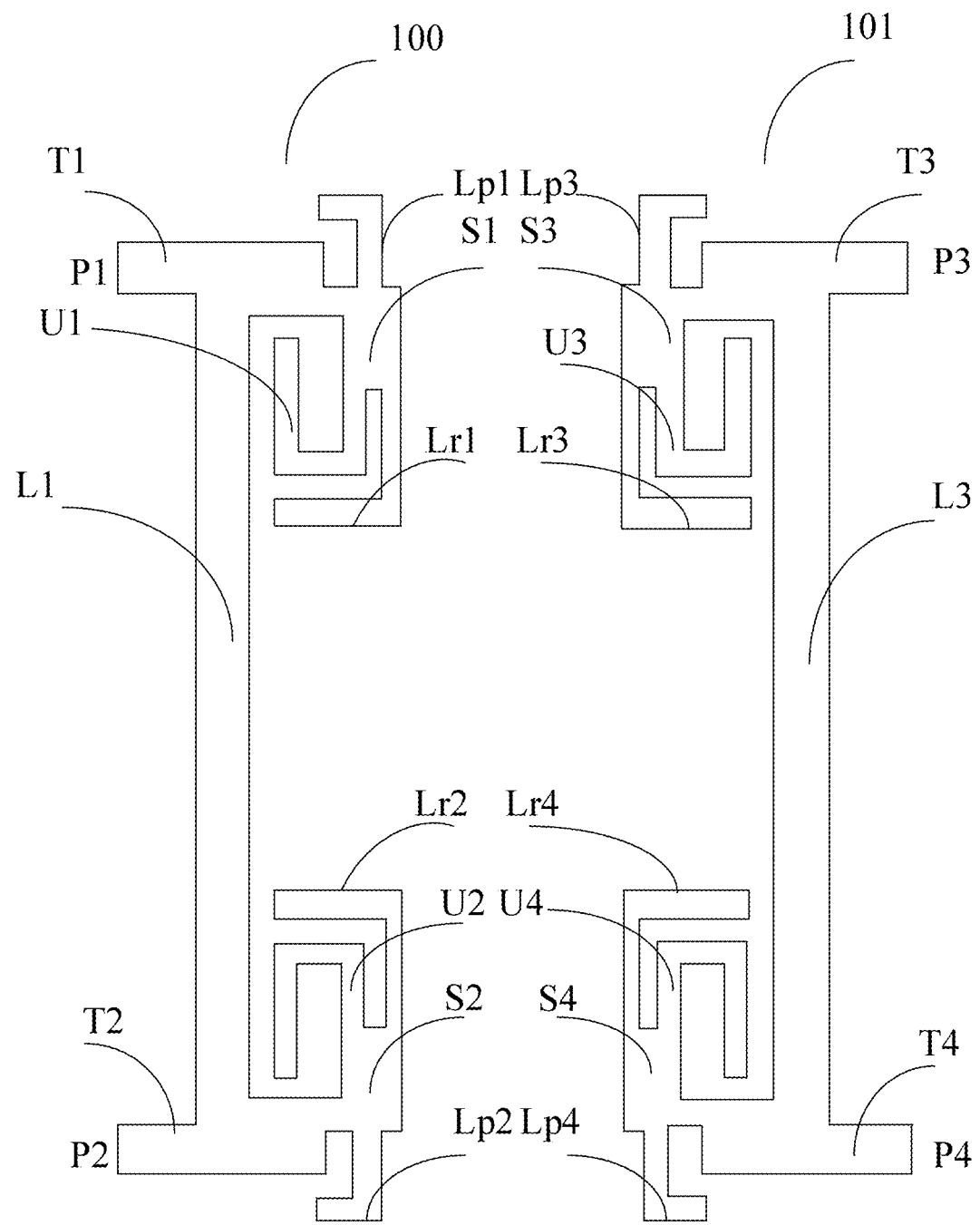
FIG. 3 is a structural diagram of a first branch and a second branch of the branch coupler according to the first embodiment of the present disclosure.

As shown in FIGS. 1-3, FIG. 1 is a three-dimensional structural diagram of a branch coupler according to a first embodiment of the present disclosure, FIG. 2 is a structural diagram of the first embodiment of a branch coupler 10 of the present disclosure, and FIG. 3 is a schematic diagram of a first branch 100 and a second branch 101 of the branch coupler 10 of the present disclosure. In the embodiment, the branch coupler 10 is applied to a communication product. As shown in FIG. 1, the branch coupler 10 includes a first branch 100 and a second branch 101. The first branch 100 and the second branch 101 are arranged on different layers of the substrate 11. In the embodiment, the first branch 100 is arranged on a first layer of the substrate 11, and the second branch 101 is arranged on a second layer of the substrate 11, which is electrically connected through a via. Structure of the first branch 100 and the second branch 101 are the same and inversely symmetrical to each other. A projection of the first branch 100 on the second surface of the substrate 11 partially overlaps with the second branch 101. Specifically, the first branch 100 includes an input end P1, an isolation end P2, a first transmission line L1, a first branch line S1 and a second branch line S2. The input end P1 is connected to the isolation end P2 through the first transmission line L1, the first branch line S1 is electrically connected to the input end P1, and the second branch line S2 is electrically connected to the isolation end P2. Similarly, the second branch 101 includes a first output end P3, a second output end P4, a second transmission line L2, a third branch line S3 and a fourth branch line S4. The first output end P3 and the second output end P4 are connected through the second transmission line L2, the third branch line S3 is electrically connected to the first output end P3, and the fourth branch line S4 is electrically connected to the second output end P4. The first branch line S1 is electrically connected to the third branch line S3 through the first via via1, and the second branch line S2 is electrically connected to the fourth branch line S4 through the second via via2. A GND layer (not shown) is also arranged between the first layer and second layer. It can be understood that the setting of each port is not used to limit the disclosure, and the setting of the ends can be designed according to an actual demand.

In the embodiment, the structures of the first branch line S1 and the second branch line S2 are the same and symmetrical, and the structures of the third branch line S3 and the fourth branch line S4 are the same and symmetrical.

In the embodiment, the first branch line S1 of the first branch 100 includes a first micro strip line T1, a first U-shaped micro strip line U1, a first L-shaped micro strip line Lr1 and a first inverted L-shaped micro strip line Lp1. One end of the first micro strip line T1 is electrically connected to the input end P1. One end of the first U-shaped micro strip line U1 is electrically connected to the first micro strip line T1, and the other end faces the first micro strip line T1 and is suspended. One end of the first L-shaped micro strip line Lr1 is electrically connected to one end of the first U-shaped micro strip line U1, and the other end is suspended and half surrounds the first U-shaped micro strip line U1. One end of the first inverted L-shaped micro strip line Lp1 is electrically connected to one end of the first U-shaped micro strip line U1, and the other end is suspended. The second branch S2 of the first branch 100 includes a second micro strip line T2, a second U-shaped micro strip line U2, a second L-shaped micro strip line Lr2 and a second inverted L-shaped micro strip line Lp2. One end of the second micro strip line T2 is electrically connected to the isolation end P2. One end of the second U-shaped micro strip line U2 is electrically connected to the second micro strip line T2, and the other end faces the second micro strip line T2 and is suspended. One end of the second L-shaped micro strip line Lr2 is electrically connected to one end of the second U-shaped micro strip line U2, and the other end is suspended and half surrounds the second U-shaped micro strip line U2. One end of the second inverted L-shaped micro strip line Lp2 is electrically connected to one end of the second U-shaped micro strip line U2, and the other end is suspended.

Similarly, structures of the first branch and the second branch 101 are the same, that is, the third branch S3 of the second branch 101 includes a third micro strip line T3, a third U-shaped micro strip line U3, a third L-shaped micro strip line Lr3 and a third inverted L-shaped micro strip line LP3, wherein one end of the third micro strip line T3 is electrically connected to the first output end P3. The connection of other micro strip lines of the third branch line S3 is similar to the first branch line S1 of the first branch 100, which will not be repeated here.

Similarly, structures of the first branch 100 and the second branch 101 are the same, that is, the fourth branch S4 of the second branch 101 includes a fourth micro strip line T4, a fourth U-shaped micro strip line U4, a fourth L-shaped micro strip line Lr4 and a fourth inverted L-shaped micro strip line Lp4, wherein one end of the fourth micro strip line T3 is electrically connected to the second output end P4. The connection of other micro strip lines of the fourth branch line S4 is similar to the second branch line S2 of the first branch 100, which will not be repeated here.

In the embodiment, the first inverted L-shaped micro strip line Lr1 is electrically connected to the third inverted L-shaped micro strip line Lr3 through the first via via1. The second inverted L-shaped micro strip line Lr2 is electrically connected to the fourth inverted L-shaped micro strip line Lp4 through the second via via2. As shown in FIG. 1, the projection of the first inverted L-shaped micro strip line LR1 on the second layer of the substrate 11 coincides with the third inverted L-shaped micro strip line Lr3, and the projection of the second inverted L-shaped micro strip line Lr2 on the second layer of the substrate 11 coincides with the fourth inverted L-shaped micro strip line Lp4.

In a specific embodiment, a distance between the projection of the first transmission line L1 on the second layer of the substrate 11 and the second transmission line L2 is 1.88 mm, a distance between the first inverted L-shaped micro strip line Lr1 and the third inverted L-shaped micro strip line Lr3 is 9.14 mm, and the size is small, which meets the miniaturization requirements of communication products. It can be understood that the setting of the distance can be adjusted according to the actual demand. Here, it is only an example and is not a limitation of the present disclosure.

Figure 4:
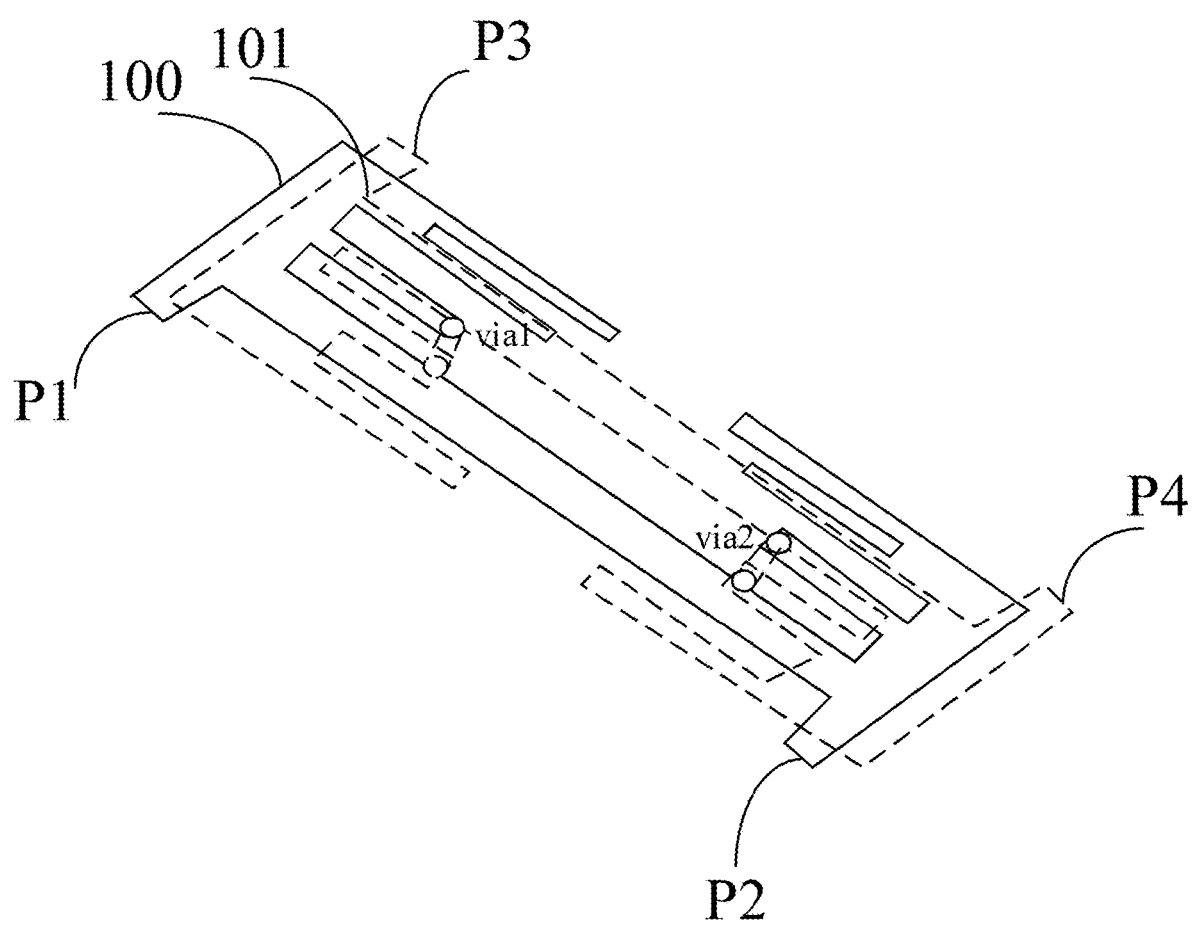
FIG. 4 is a structural diagram of a branch coupler according to another embodiment of the present disclosure.
Figure 5:
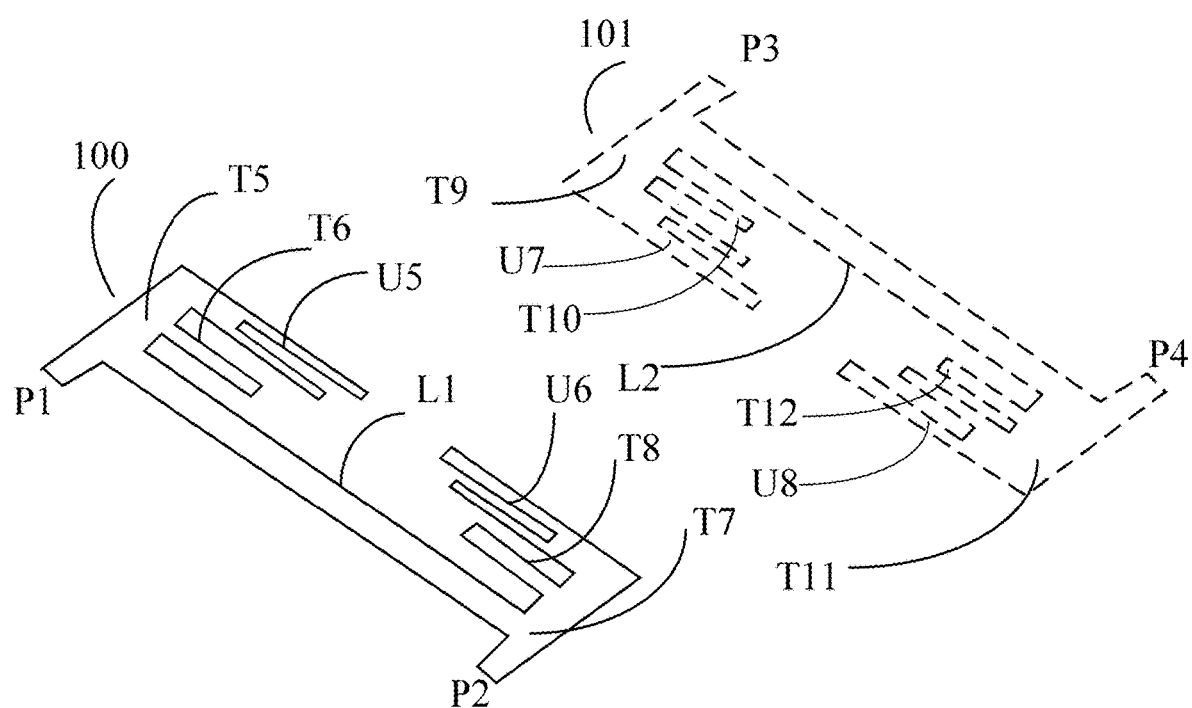
FIG. 5 is a structural diagram of a first branch and a second branch of the branch coupler according to another embodiment of the present disclosure.

In other embodiments of the present disclosure, the first branch 100 and the second branch 101 can be other structures. As shown in FIGS. 4-5, FIG. 4 is a structural diagram of the branch coupler 10 according to another embodiment of the present disclosure, and FIG. 5 is a structural diagram of the first branch 100 and the second branch 101 of the branch coupler 10 according to another embodiment of the present disclosure. In the embodiment, the first branch line S1 of the first branch 100 may include a fifth micro strip line T5, a sixth micro strip line T6 and a fifth U-shaped micro strip line U5. The fifth micro strip line T5 is electrically connected to the input end P1. One end of the sixth micro strip line T6 is vertically electrically connected to the fifth micro strip line T5. The bottom of the fifth U-shaped micro strip line U5 is vertically connected to the fifth micro strip line T5. As shown in the figure, the lengths of the two extension lines perpendicular to the bottom of the fifth U-shaped micro strip line U5 are different. The second branch S2 of the first branch 100 may include a seventh micro strip line T7, an eighth micro strip line T8 and a sixth U-shaped micro strip line U6. The seventh micro strip line T7 is electrically connected to the isolation end P2. One end of the eighth micro strip line T8 is vertically electrically connected to the seventh micro strip line T7. The bottom of the sixth U-shaped micro strip line U6 is vertically connected to the seventh micro strip line T7. As shown in the figure, the lengths of the two extension lines perpendicular to the bottom of the sixth U-shaped micro strip line U6 are different.

Similarly, structures of the second branch 101 and the first branch 100 are the same, and the third branch line S3 of the second branch 101 includes a ninth micro strip line T9, a tenth micro strip line T10 and a seventh U-shaped micro strip line U7. The fourth branch line S4 of the second branch 101 includes an eleventh micro strip line T11, a twelfth micro strip line T12 and an eighth U-shaped micro strip line U8. The connection of the above micro strip lines is the same as the first branch line S1 and the second branch line S2 of the first branch 100, which will not be repeated here.

In the embodiment, structures of the first branch 100 and the second branch 101 are the same and reverse symmetrical. The structures of the first branch line S1 and the second branch line S2 are the same and symmetrical to each other, and the structures of the third branch line S3 and the fourth branch line S4 are the same and symmetrical to each other. The input end P1 is parallel to the isolation end P2, and the first output end P3 is parallel to the second output end P4.

In another embodiment of the present disclosure, structures of the first branch line S1 and the second branch line S2 are the same and symmetrical to each other, and structures of the third branch line S3 and the fourth branch line S4 are the same structure and symmetrical to each other. The projection of the first branch line S1 on the second layer of the substrate 11 coincides with the third branch line S3, and the projection of the second branch line S2 on the second layer of the substrate 11 coincides with the projection of the fourth branch line S4. The projection of the first transmission line L1 on the second surface of the substrate 11 coincides with the second transmission line L2. The input end P1 and the isolation end P2 extend along both ends of the first transmission line L1, and the first output end P3 is parallel to the second output end P4. It can be understood that in other embodiments, there can be other ways of port setting, which is not limited here.

Figure 6:
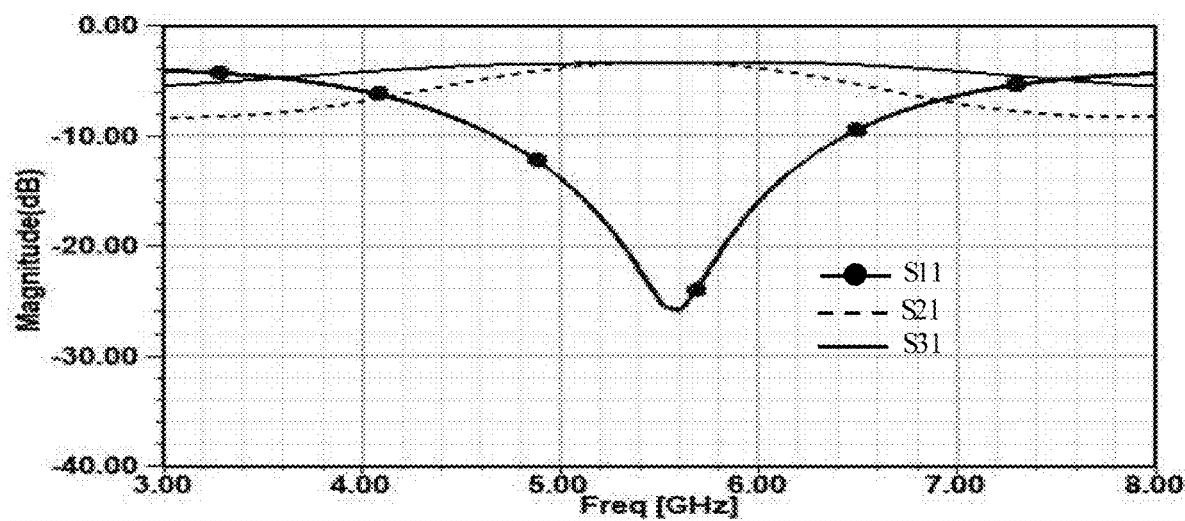
FIG. 6 is an S-parameter simulation diagram of the branch coupler according to an embodiment of the present disclosure.

Referring to FIG. 6, FIG. 6 is an S-parameter simulation diagram of the branch coupler 10 according to an embodiment of the present disclosure. As shown in the figure, the frequency band in which the attenuation of branch coupler parameter S11 is greater than 10 dB is about 4.8 GHz-6.3 GHz, and the center frequency is 5.6 GHz.

Figure 7:
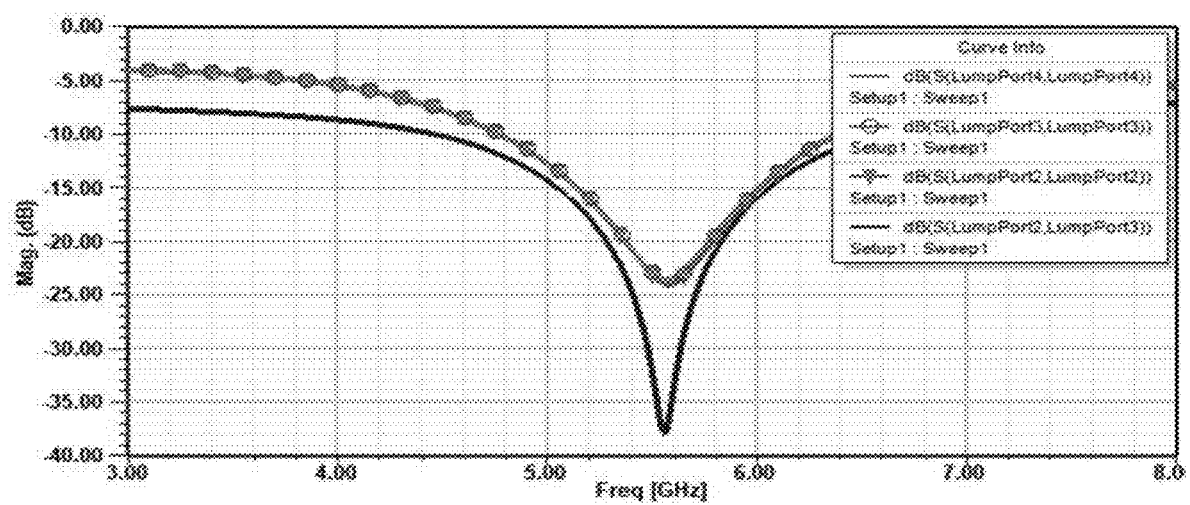
FIG. 7 is a simulation diagram of an output end isolation S parameter of the branch coupler according to an embodiment of the present disclosure.

Referring to FIG. 7, FIG. 7 is a simulation diagram of the output end isolation parameters S11, S21 and S31 of the branch coupler 10 according to the first embodiment of the present disclosure. The two outputs of the branch coupler 10 have good isolation in the frequency band of 4.6 GHz-6.6 GHz.

Figure 8:
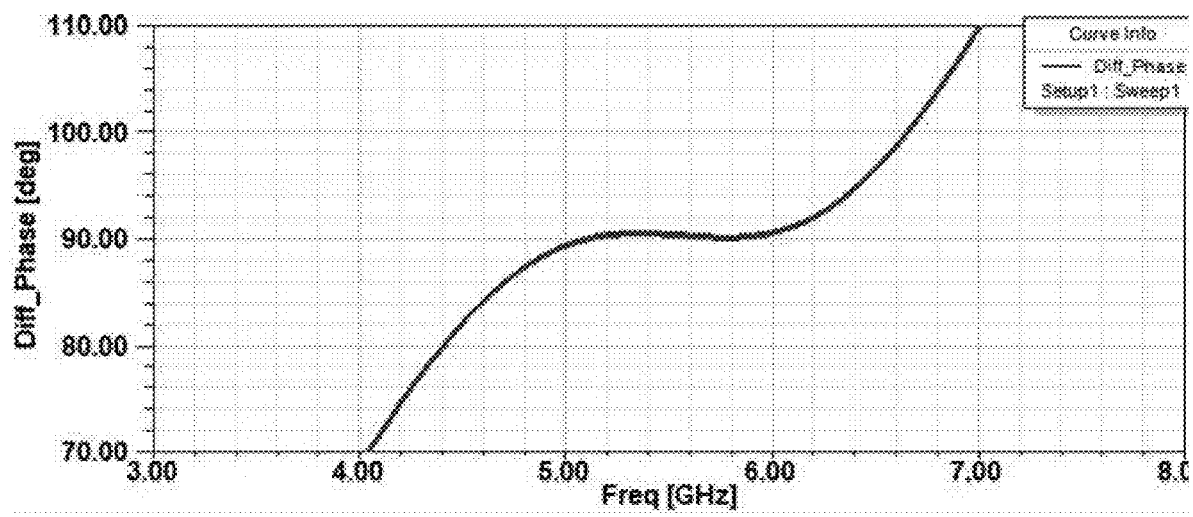
FIG. 8 is a phase difference diagram of the branch coupler according to the first embodiment of the present disclosure.

Referring to FIG. 8, FIG. 8 is a phase difference diagram of the branch coupler 10 according to the first embodiment of the present disclosure. As shown in the figure, the first output end P3 and the second output end P4 have a small phase difference in the frequency band of 4.9 GHz-6.2 GHz, and the phase difference is less than 10°.

Figure 9:
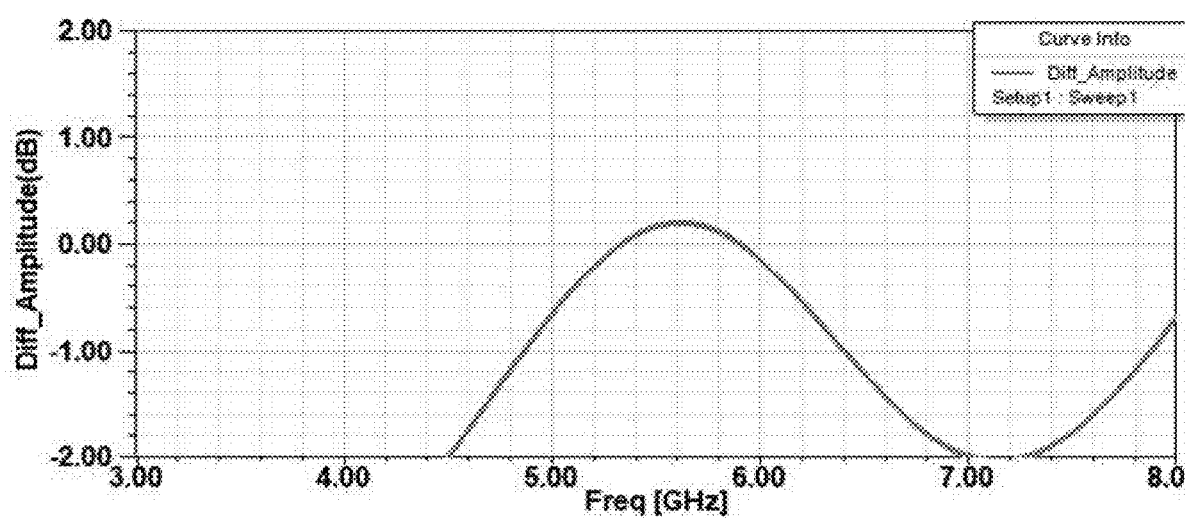
FIG. 9 is an amplitude difference diagram of the branch coupler according to the first embodiment of the present disclosure.

Referring to FIG. 9, FIG. 9 is an amplitude difference diagram of the branch coupler 10 according to the first embodiment of the present disclosure. As shown in the figure, the first output end P3 and the second output end P4 have a small amplitude output difference in the frequency band of 4.9 GHz-6.2 GHz, and the amplitude difference is less than 2 dB.

Compared with the prior art, the branch coupler provided by the embodiment of the present disclosure includes the first branch and the second branch arranged on different planes on the substrate. The first branch and the second branch are electrically connected through vias, which reduces the area of the branch coupler and meets the miniaturization requirements of communication products on a premise of ensuring the performance.

Many details are often found in the art such as the other features of a mobile terminal. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A branch coupler, arranged on a substrate, comprising:
a first branch, arranged on a first layer of the substrate, comprising an input end, an isolation end, a first transmission line, a first branch line and a second branch line, the input end is electrically connected to the isolation end through the first transmission line, the first branch line is electrically connected to the input end, and the second branch line is electrically connected to the isolation end, wherein the first branch line comprises a first U-shaped micro strip line, one end of the first U-shaped micro strip line is electrically connected to the input end, and the other end is suspended and the second branch line comprises a second U-shaped micro strip line, one end of the second U-shaped micro strip line is electrically connected to the isolation end, and the other end is suspended;
a second branch, arranged on a second layer of the substrate, comprising a first output end, a second output end, a second transmission line, a third branch line and a fourth branch line, the first output end and the second output end are connected through the second transmission line, the third branch line is electrically connected to the first output end, and the fourth branch line is electrically connected to the second output end;
wherein the first branch line is electrically connected to the third branch line through a first via, and the second branch line is electrically connected to the fourth branch line through a second via;
the first branch line of the first branch further comprises:
a first micro strip line, one end of the first micro strip line is electrically connected to the input end;
a first L-shaped micro strip line, one end of the first L-shaped micro strip line is electrically connected to one end of the first U-shaped micro strip line, and the other end of the first L-shaped micro strip line is suspended and half surrounds the first U-shaped micro strip line;
a first inverted L-shaped micro strip line, one end of the first inverted L-shaped micro strip line is electrically connected to one end of the first U-shaped micro strip line, and the other end of the first inverted L-shaped micro strip line is suspended;
the second branch line of the first branch further comprises:
a second micro strip line, one end of the second micro strip line is electrically connected to the isolation end;
a second L-shaped micro strip line, one end of the second L-shaped micro strip line is electrically connected to one end of the second U-shaped micro strip line, the other end is suspended and half surrounds the second U-shaped micro strip line;
a second inverted L-shaped micro strip line, one end of the second inverted L-shaped micro strip line is electrically connected to one end of the second U-shaped micro strip line, and the other end is suspended; and
the third branch line of the second branch comprises:
a third micro strip line, one end of the third micro strip line is electrically connected to the input end;
a third U-shaped micro strip line, one end of the third U-shaped micro strip line is electrically connected to the third micro strip line, and the other end faces the first micro strip line and is suspended;
a third L-shaped micro strip line, one end of the third L-shaped micro strip line is electrically connected to one end of the third U-shaped micro strip line, and the other end is suspended and half surrounds the third U-shaped micro strip line;
a third inverted L-shaped micro strip line, one end of the third inverted L-shaped micro strip line is electrically connected to one end of the third U-shaped micro strip line, and the other end is suspended;
the fourth branch line of the second branch comprises:
a fourth micro strip line, one end of the a fourth micro strip line is electrically connected to the input end;
a fourth U-shaped micro strip line, one end of the fourth U-shaped micro strip line is electrically connected to the fourth micro strip line, and the other end faces the first micro strip line and is suspended;
a fourth L-shaped micro strip line, one end of the fourth L-shaped micro strip line is electrically connected to one end of the fourth U-shaped micro strip line, and the other end is suspended and half surrounds the fourth U-shaped micro strip line;
a fourth inverted L-shaped micro strip line, one end of the fourth inverted L-shaped micro strip line is electrically connected to one end of the fourth U-shaped micro strip line, and the other end is suspended.

2. The branch coupler of claim 1, wherein structures of the first branch and the second branch are the same and inversely symmetrical, structures of the first branch line and the second branch line are the same and symmetrical, and structures of the third branch line and fourth branch line are the same and symmetrical.

3. The branch coupler of claim 1, wherein the first inverted L-shaped micro strip line is electrically connected to the third inverted L-shaped micro strip line through the first via;
the second inverted L-shaped micro strip line is electrically connected to the fourth inverted L-shaped micro strip line through the second via hole.

4. A branch coupler, arranged on a substrate, comprising:
a first branch, arranged on a first layer of the substrate, comprising an input end, an isolation end, a first transmission line, a first branch line and a second branch line, the input end is electrically connected to the isolation end through the first transmission line, the first branch line is electrically connected to the input end, and the second branch line is electrically connected to the isolation end, wherein the first branch line comprises a first U-shaped micro strip line, one end of the first U-shaped micro strip line is electrically connected to the input end, and the other end is suspended and the second branch line comprises a second U-shaped micro strip line, one end of the second U-shaped micro strip line is electrically connected to the isolation end, and the other end is suspended;
a second branch, arranged on a second layer of the substrate, comprising a first output end, a second output end, a second transmission line, a third branch line and a fourth branch line, the first output end and the second output end are connected through the second transmission line, the third branch line is electrically connected to the first output end, and the fourth branch line is electrically connected to the second output end;
wherein the first branch line is electrically connected to the third branch line through a first via, and the second branch line is electrically connected to the fourth branch line through a second via;
the first branch line of the first branch comprises:
a fifth micro strip line, electrically connected to the input end;
a sixth micro strip line, one end of the sixth micro strip line is electrically connected to the fifth micro strip line;
a fifth U-shaped micro strip line, a bottom of the fifth U-shaped micro strip line is connected to the fifth micro strip line;
the second branch line of the first branch comprises:

a seventh micro strip line, electrically connected to the isolation end;
an eighth micro strip line, one end of the eighth micro strip line is electrically connected to the seventh micro strip line;
a sixth U-shaped micro strip line, a bottom of the sixth U-shaped micro strip line is connected to the seventh micro strip line;
the third branch line of the second branch comprises:
a ninth micro strip line, electrically connected to the first output end;
a tenth micro strip line, one end of the tenth micro strip line is electrically connected to the ninth micro strip line;
a seventh U-shaped micro strip line, a bottom of the seventh U-shaped micro strip line is connected to the ninth micro strip line;
the fourth branch line of the second branch includes:
an eleventh micro strip line, electrically connected to the second output end;
a twelfth micro strip line, one end of the twelfth micro strip line is electrically connected to the eleventh micro strip line;
an eighth U-shaped micro strip line, a bottom of the eighth U-shaped micro strip line is connected to the eleventh micro strip line.

5. The branch coupler of claim 4, wherein the sixth micro strip line and the tenth micro strip line are electrically connected through the first via;
the eighth micro strip line and the twelfth micro strip line are electrically connected through the second via.

6. The branch coupler of claim 4, wherein structures of the first branch and the second branch are the same and inversely symmetrical;
structures of the first branch line and the second branch line are the same structure and symmetrical, and structures of the third branch line and the fourth branch line are the same structure and symmetrical;
the input end is parallel to the isolation end, and the first output end is parallel to the second output end.

7. The branch coupler of claim 4, wherein structures of the first branch line and the second branch line are the same structure and symmetrical, and structures of the third branch line and the fourth branch line are the same structure and symmetrical;
the input end and the isolation end extend along both ends of the first transmission line respectively, and the first output end is parallel to the second output end.

* * * * *